(12) United States Patent
Yang et al.

(10) Patent No.: US 10,224,367 B2
(45) Date of Patent: Mar. 5, 2019

(54) SELECTOR DEVICE INCORPORATING CONDUCTIVE CLUSTERS FOR MEMORY APPLICATIONS

(71) Applicant: Avalanche Technology, Inc., Fremont, CA (US)

(72) Inventors: Hongxin Yang, Newark, CA (US); Kimihiro Satoh, Fremont, CA (US); Xiaobin Wang, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 221 days.

(21) Appl. No.: 15/157,607

(22) Filed: May 18, 2016

(65) Prior Publication Data

US 2017/0338279 A1 Nov. 23, 2017

(51) Int. Cl.
| | |
|---|---|
| *H01L 27/22* | (2006.01) |
| *H01L 43/08* | (2006.01) |
| *H01L 45/00* | (2006.01) |
| *H01L 27/24* | (2006.01) |

(52) U.S. Cl.
CPC ........ *H01L 27/224* (2013.01); *H01L 27/2409* (2013.01); *H01L 27/2481* (2013.01); *H01L 45/085* (2013.01); *H01L 45/1253* (2013.01); *H01L 45/14* (2013.01)

(58) Field of Classification Search
None
See application file for complete search history.

(56) References Cited

U.S. PATENT DOCUMENTS

| | | | |
|---|---|---|---|
| 2007/0159869 A1* | 7/2007 | Baek | G11C 11/16 365/148 |
| 2014/0209892 A1* | 7/2014 | Kuo | G11C 8/10 257/43 |
| 2014/0264224 A1* | 9/2014 | Zhang | H01L 45/14 257/2 |
| 2015/0137060 A1* | 5/2015 | Sun | H01L 27/2409 257/4 |
| 2015/0263069 A1* | 9/2015 | Jo | H01L 45/085 365/148 |
| 2016/0020250 A1 | 1/2016 | Li et al. | |
| 2016/0149128 A1* | 5/2016 | Bodke | H01L 45/1286 257/4 |
| 2017/0125674 A1* | 5/2017 | Yang | H01L 45/08 |
| 2017/0271406 A1* | 9/2017 | Yang | H01L 45/04 |

* cited by examiner

*Primary Examiner* — Khaja Ahmad
(74) *Attorney, Agent, or Firm* — Bing K. Yen (57) ABSTRACT

The present invention is directed to a memory device that includes an array of memory cells. Each of the memory cells includes a memory element connected to a two-terminal selector element. The two-terminal selector element includes a first electrode and a second electrode with a switching layer interposed therebetween. The switching layer includes a plurality of metal-rich clusters embedded in a nominally insulating matrix. One or more conductive paths are formed in the switching layer when an applied voltage to the memory cell exceeds a threshold level. Each of the memory cells may further include an intermediate electrode interposed between the memory element and the two-terminal selector element. The two-terminal selector element may further include a third electrode formed between the first electrode and the switching layer, and a fourth electrode formed between the second electrode and the switching layer.

20 Claims, 10 Drawing Sheets

SELECTOR DEVICE INCORPORATING CONDUCTIVE CLUSTERS FOR MEMORY APPLICATIONS

BACKGROUND

The present invention relates to a selector device for memory applications, and more particularly, to embodiments of a two-terminal selector device incorporating therein conductive clusters.

A resistance-based memory device normally comprises an array of memory cells, each of which includes a memory element and a selector element coupled in series between two electrodes. The selector element functions like a switch to direct voltage or current through the selected memory element coupled thereto. The selector element may be a three terminal device, such as transistor, or a two-terminal device, such as diode or Ovonic threshold switch (OTS). Upon application of an appropriate voltage or current to the selected memory element, the electrical property of the memory element would change accordingly, thereby switching the stored logic in the respective memory cell.

Figure 1:
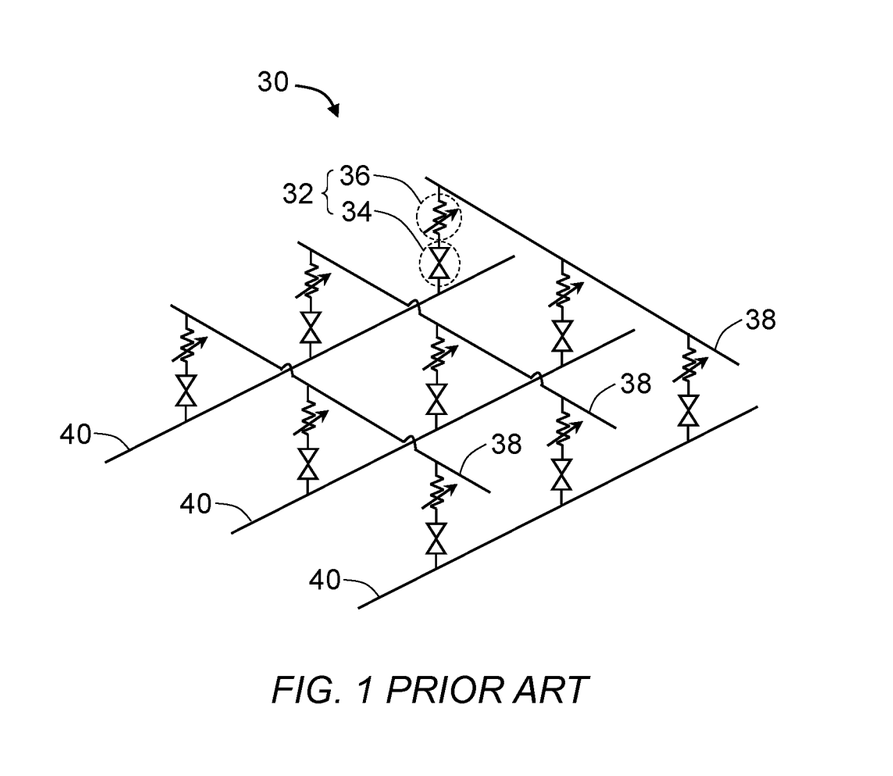
FIG. 1 is a schematic circuit diagram of a memory array including a plurality of memory cells with each comprising a memory element and a two-terminal selector element coupled in series between two electrodes.

FIG. 1 is a schematic circuit diagram of a memory array 30, which comprises a plurality of memory cells 32 with each of the memory cells 32 including a two-terminal selector element 34 coupled to a resistance-based memory element 36 in series; a first plurality of parallel wiring lines 38 with each being coupled to a respective row of the memory elements 36 in a first direction; and a second plurality of parallel wiring lines 40 with each being coupled to a respective row of the selector elements 34 in a second direction substantially perpendicular to the first direction. Accordingly, the memory cells 32 are located at the cross points between the first and second plurality of wiring lines 38 and 40.

The resistance-based memory element 36 may be classified into at least one of several known groups based on its resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

A magnetic memory element normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

The use of the two-terminal selector element 34 allows the memory cells 32 to attain the minimum cell size of $4F^2$, where F denotes the minimum feature size or one half the minimum feature pitch normally associated with a particular manufacturing process, thereby increasing memory array density. However, conventional bi-directional, two-terminal selector devices, such as Ovonic threshold switch (OTS), have relatively low on/off switching speeds and are prone to current leakage compared with conventional selection transistors.

For the foregoing reasons, there is a need for a two-terminal selector device for memory applications that has high on/off switching speeds and low current leakage and that can be inexpensively manufactured.

SUMMARY

The present invention is directed to a device that satisfies this need. A memory device having features of the present invention comprises an array of memory cells. Each of the memory cells includes a memory element connected to a two-terminal selector element. The two-terminal selector element includes a first electrode and a second electrode with a switching layer interposed therebetween. The switching layer includes a plurality of metal-rich clusters embedded in a nominally insulating matrix. One or more conductive paths may form in the switching layer when an applied voltage to the memory cell exceeds a threshold level. Each of the memory cells may further include an intermediate electrode interposed between the memory element and the two-terminal selector element. The two-terminal selector element may further include a third electrode formed between the first electrode and the switching layer, and a fourth electrode formed between the second electrode and the switching layer.

The matrix of the switching layer may be made of a suitable chalcogenide or oxide. The plurality of metal-rich clusters may be made of silver, copper, zinc, titanium, titanium nitride, tantalum nitride, tungsten, or any combination thereof. The first and second electrodes each may be made of platinum, iridium, ruthenium, or any combination thereof. The first and second electrodes may be symmetric or asymmetric. Likewise, the third and fourth electrodes may be symmetric or asymmetric.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

In the following description, directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element as illustrated in the figure. Since articles and elements can be positioned in a number of different orientations, these terms are intended for illustration purposes and in no way limit the invention.

Figure 2:
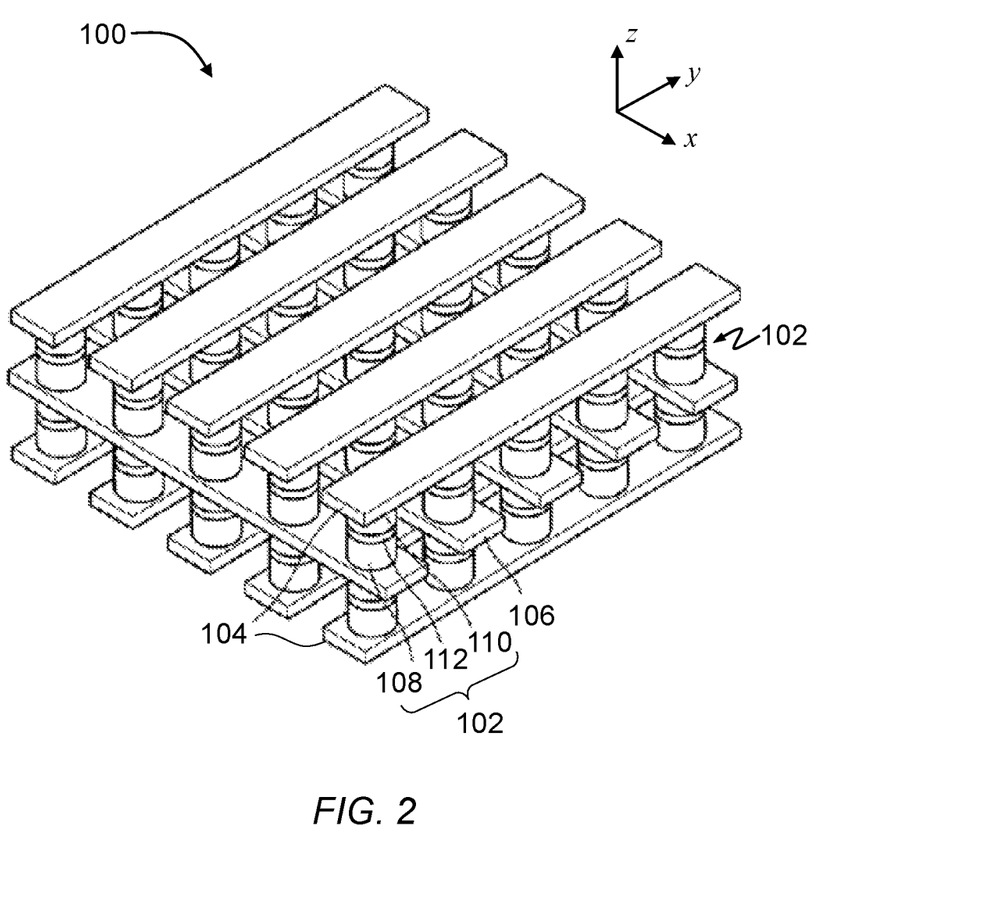
FIG. 2 is a perspective view of a three dimensional memory device in accordance with an embodiment of the present invention.

An embodiment of the present invention as applied to a memory device having multiple layers of memory cells will now be described with reference to FIG. 2. Referring now to FIG. 2, the illustrated device comprises two layers of memory cells 102 with each layer of the memory cells 102 formed between a layer of parallel first conductor lines 104 extending along the y-direction and a layer of parallel second conductor lines 106 extending along the x-direction, which is substantially perpendicular to the y-direction. For each layer of the memory cells 102, each of the first conductor lines 104 couples to one ends (top or bottom) of a respective row of the memory cells 102 along the y-direction, while each of the second conductor lines 106 couples to the other ends (top or bottom) of a respective row of the memory cells 102 along the x-direction. Two adjacent layers of the memory cells 102 share a layer of the second conductor lines 106. Accordingly, each of the second conductor lines 106 are coupled to two rows of memory cells thereabove and therebeneath, respectively. For reasons of clarity, only two layers of the memory cells 102 are shown in FIG. 2. However, the present invention can accommodate as many layers of the memory cells 102 as desired. For example, a third layer of memory cells (not shown) may be formed on top of the top layer of the first conductor lines 104 and another layer of the second conductor lines (not shown) may be formed on top of the third layer of memory cells, and so forth. The first and second conductor lines 104 and 106 may operate as word lines and bit lines, respectively, or vice versa. Each of the memory cells 102 includes a memory element 108 and a two-terminal selector element 110 coupled in series. Each of the memory cells 102 may further include an optional intermediate electrode 112 interposed between the memory element 108 and the two-terminal selector element 110.

Figure 3A:
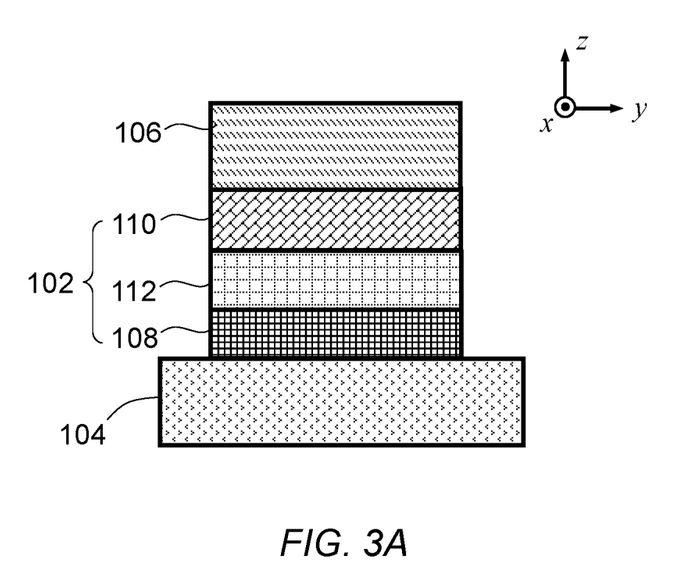
FIGS. 3A and 3B are cross sectional views of one of memory cells in accordance with different embodiments of the present invention.

FIG. 3A is a cross sectional view of one of the memory cells 102, which includes the memory element 108 formed on top of one of the first conductor lines 104 extending along the y-direction, the two-terminal selector element 110 formed on top of the memory element 108, and the optional intermediate electrode 112 interposed therebetween. One of the second conductor lines 106 forms on top of the two-terminal selector element 110 and extends along the x-direction. In embodiments where the optional intermediate electrode 112 is absent, the two-terminal selector element 110 is directly coupled to the memory element 108.

Figure 3B:
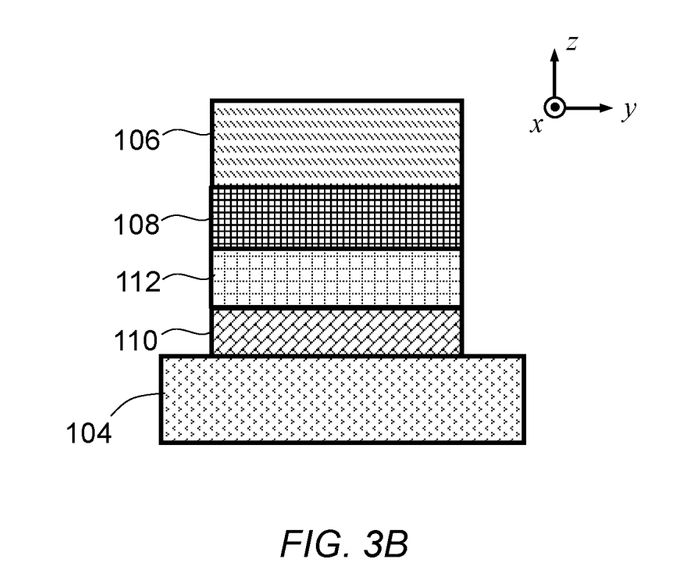

The stacking order of the two-terminal selector element 110 and the memory element 108 may alternatively be reversed, as illustrated in FIG. 3B, such that the memory element 108 is formed on top of the two-terminal selector element 110 with the optional intermediate electrode interposed therebetween. Each layer of the memory cells 102 may have the configuration illustrated in FIG. 3A or 3B.

One or more of the first conductor lines 104 and the second conductor lines 106 may be made of any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), or any combination thereof.

The optional intermediate electrode 112 may be made of any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), tungsten silicide ($WSi_x$), titanium silicide ($TiSi_x$), cobalt silicide ($CoSi_x$), nickel silicide ($NiSi_x$), platinum silicide ($PtSi_x$), or any combination thereof.

The memory element 108 may change the resistance state thereof by any suitable switching mechanism, such as but not limited to phase change, precipitate bridging, magnetoresistive switching, or any combination thereof. In one embodiment, the memory element 108 comprises a phase change chalcogenide compound, such as but not limited to $Ge_2Sb_2Te_5$ or AgInSbTe, which can switch between a resistive phase and a conductive phase. In another embodiment, the memory element 108 comprises a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, the memory element 108 comprises a magnetic free layer and a magnetic reference layer with an insulating electron tunnel junction layer interposed therebetween, collectively forming a magnetic tunnel junction (MTJ). When a switching pulse is applied, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may orientations that are parallel to layer planes thereof.

Figure 4A:
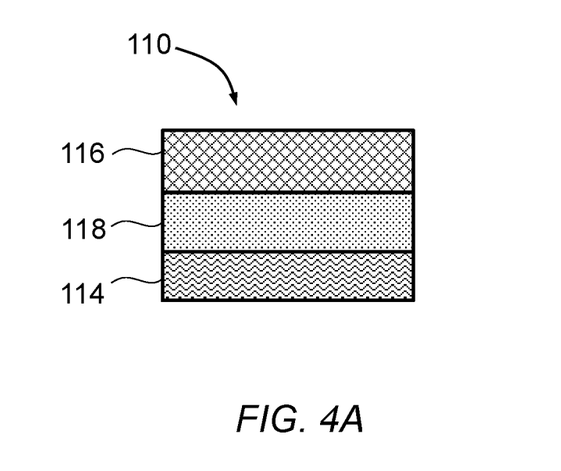
FIGS. 4A and 4B are cross sectional views of a two-terminal selector element and a switching layer therein, respectively, in accordance with an embodiment of the present invention.

FIG. 4A is a cross sectional view illustrating the structure of the two-terminal selector element 110 in accordance with an embodiment of the present invention. The two-terminal selector element 110 includes a first electrode 114 and a second electrode 116 with a switching layer 118 interposed therebetween. One or more of the first and second electrodes 114 and 116 may be made of any suitable electrode material, such as but not limited to platinum (Pt), iridium (Ir), titanium (Ti), tungsten (W), aluminum (Al), copper (Cu), indium-tin oxide (ITO), gold (Au), silver (Ag), or any combination thereof. In one embodiment, the first and second electrodes 114 and 116 are made of the same material, or are "symmetric" with respect to the switching layer 118. In an alternative embodiment, the first and second electrodes 114 and 116 are made of different materials, or are "asymmetric" with respect to the switching layer 118.

Figure 4B:
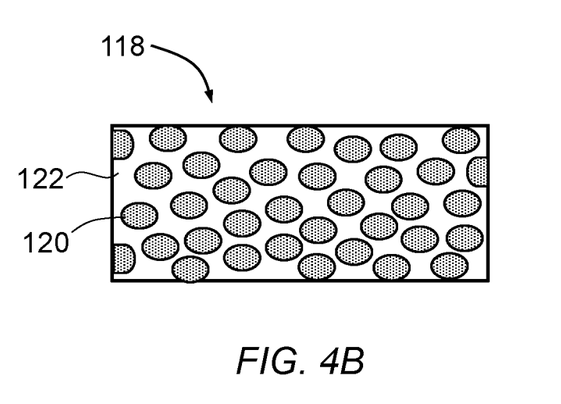

FIG. 4B is a cross sectional view illustrating the structure of the switching layer 118 in accordance with another embodiment of the present invention. The switching layer 118 comprises a plurality of metal-rich clusters 120 embedded in a nominally semi-conducting or insulating matrix 122. The matrix 122 of the switching layer 118 may be made of a suitable stoichiometric or near-stoichiometric insulator compound, or a suitable non-stoichiometric insulator compound, or a suitable chalcogenide, or a suitable solid electrolyte, or any combination thereof. Examples of the suitable stoichiometric or near-stoichiometric insulator compound include silicon oxide ($SiO_2$), silicon nitride ($Si_3N_4$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), tungsten oxide ($WO_3$), hafnium oxide ($HfO_2$), zirconium oxide ($ZrO_2$), nickel oxides (NiO, $Ni_2O_3$), iron oxide ($Fe_2O_3$), yttrium oxide ($Y_2O_3$), europium oxide ($Eu_2O_3$), and any combinations thereof. Examples of the suitable non-stoichiometric oxide include $SiO_x$, $SiN_x$, $AlO_x$, $MgO_x$, $TaO_x$, $VO_x$, $NbO_x$, $TiO_x$, $WO_x$, $HfO_x$, $ZrO_x$, $NiO_x$, $FeO_x$, $YO_x$, $EuO_x$, and any combinations thereof. Examples of the suitable chalcogenide include GeTe, $Sb_2Te_3$, GeSb, $Ge_2Sb_2Te_5$, $GeSbTe_2$, $Sb_3Te_7$, and any combinations thereof. The suitable solid electrolyte for the matrix 122 may comprise one or more of the following elements: Ge, Sb, S, Se, In, Ga, Sn, As, and Te.

The plurality of metal-rich clusters 120 may be made of a noble metal, or an alloy including one or more noble metals, or a fast electric field enhanced diffuser material, or any combination thereof. Examples of the noble metal include gold (Au), silver (Ag), platinum (Pt), palladium (Pd), rhodium (Rh), iridium (Ir), ruthenium (Ru), osmium (Os), and rhenium (Re). Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), and tungsten nitride (WN). In an embodiment, the plurality of metal-rich clusters 120 are made of a same material as at least one of the first and second electrodes 114 and 116.

Operation of the two-terminal selector element 110 will now be described with reference to the current-voltage (I-V) response plot illustrated in FIG. 5A. The I-V plot shows the magnitude of electric current passing through the two-terminal selector element 110 as the voltage applied to the selector element 110 varies. Initially, the current gradually increases with the applied voltage from zero to near a threshold voltage, $V_{th}$. At or near $V_{th}$, the current rapidly increases and exhibits a highly non-linear behavior. As the voltage continues to increase beyond $V_{th}$, the current increase becomes gradual again until reaching $I_{on}$ and corresponding voltage $V_p$, which are programming current and voltage for the memory element 108, respectively. The current response behaves like a step function as the applied voltage increases from zero to $V_p$ with the sharp increase occurring at or near $V_{th}$, which may include a narrow range of voltage values.

Figure 6A:
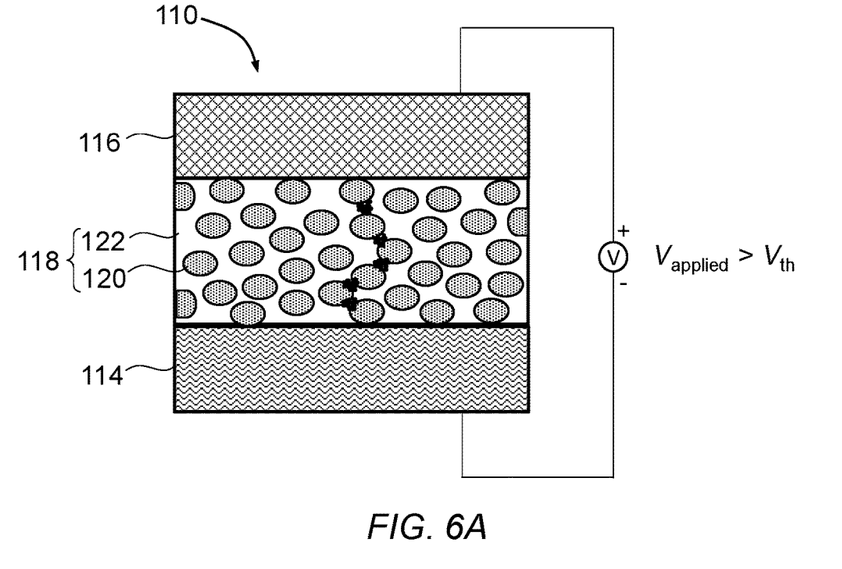
FIGS. 6A-6D illustrate various stages in formation of a conductive path in a switching layer by applying a positive voltage to a top electrode.

Without being bound to any theory, it is believed that one or more conductive paths or filaments are formed within the switching layer 118 when the applied voltage, $V_{applied}$, exceeds $V_{th}$ as illustrated in FIG. 6A, resulting in the two-terminal selector element 110 being in a highly conductive state. In response to the applied voltage that is greater than $V_{th}$, ions and/or ionic particles from at least one of the first and second electrodes 114 and 116 may migrate into the switching layer 118 to form conductive bridges between the metal-rich clusters 120, thereby forming one or more conductive paths between the first and second electrodes 114 and 116 through the switching layer 118. Alternatively, ions and/or ionic particles from the metal-rich clusters 120 may migrate and form the conductive bridges between the metal-rich clusters 120 within the switching layer 118. Therefore, the ions and/or ionic particles for forming conductive bridges may come from at least one of the first and second electrodes 114 and 116, or the metal-rich clusters 120, or both. It should be noted that there are various possible mechanisms that can cause ions and/or ionic particles to migrate, such as but not limited to electric field, electric current, and joule heating, in the presence of the applied voltage.

Referring back to FIG. 5A, as the voltage applied to the selector element 110 decreases from $V_p$ to near a holding voltage, $V_{hold}$, that is lower than $V_{th}$, the current gradually decreases and the selector element 110 remains in the highly conductive state. The conductive paths previously formed in the switching layer 118 remain mostly intact as illustrated in FIG. 6B.

Figure 6B:
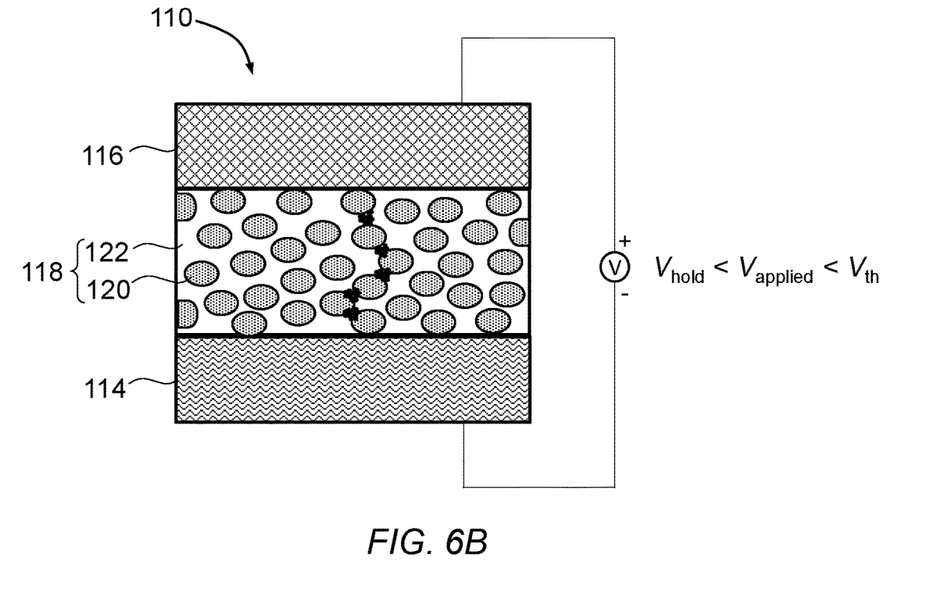
Figure 6C:
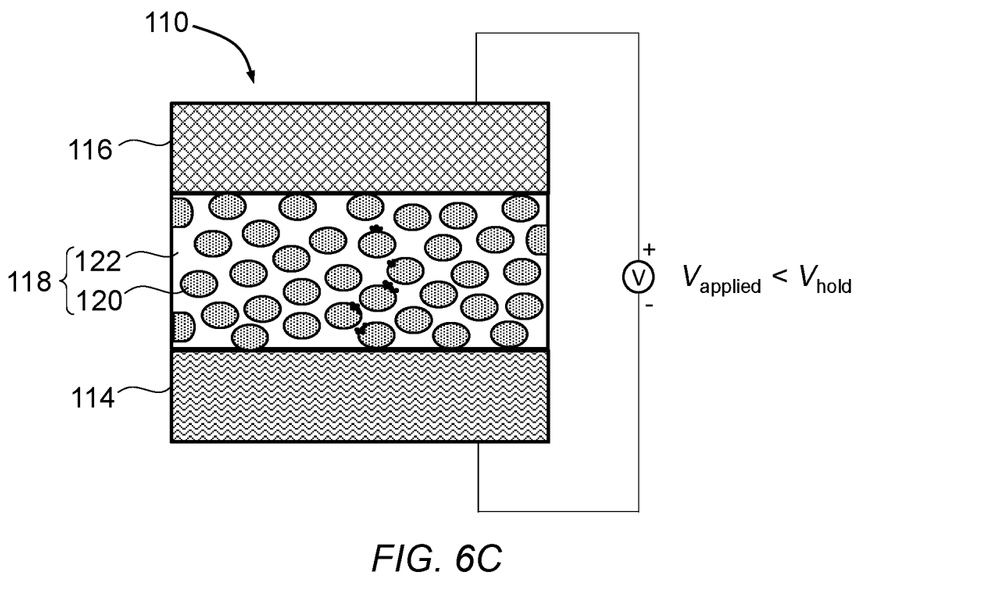
Figure 6D:
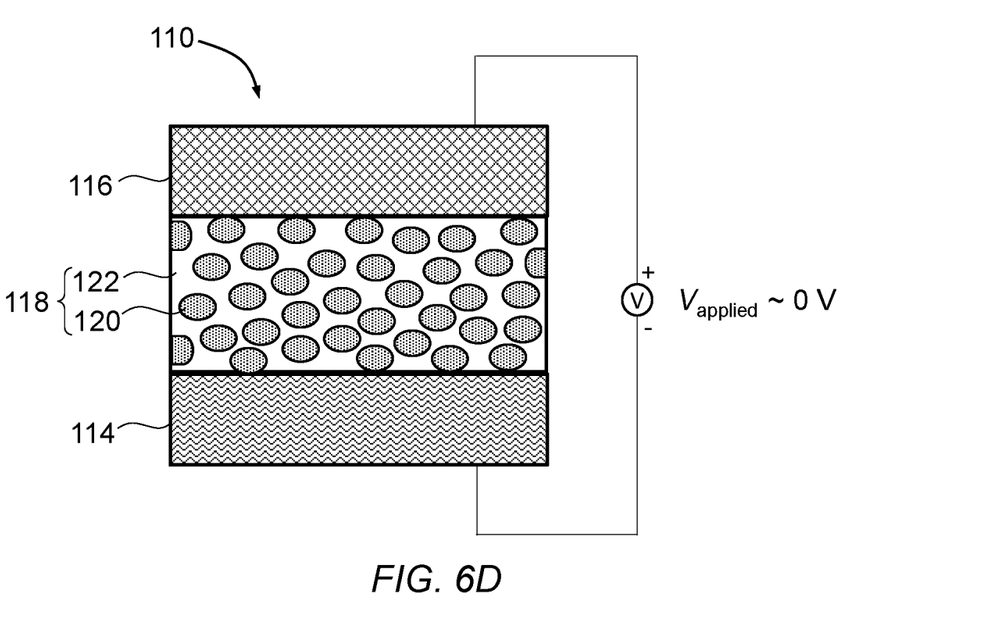

At or near $V_{hold}$, the current rapidly decreases and exhibits a highly non-linear behavior. As the voltage continues to decrease beyond $V_{hold}$, the current decrease becomes gradual again. When the voltage drops below $V_{hold}$, the conductive bridges disintegrate and the one or more conductive paths between the electrodes 114 and 116 break down as illustrated in FIG. 6C, returning the selector element 110 back to a semi-conducting or insulating state. At zero voltage, the conductive bridges disappear and the switching layer 118 remains in the original semi-conducting or insulating state as illustrated in FIG. 6D.

Figure 5A:
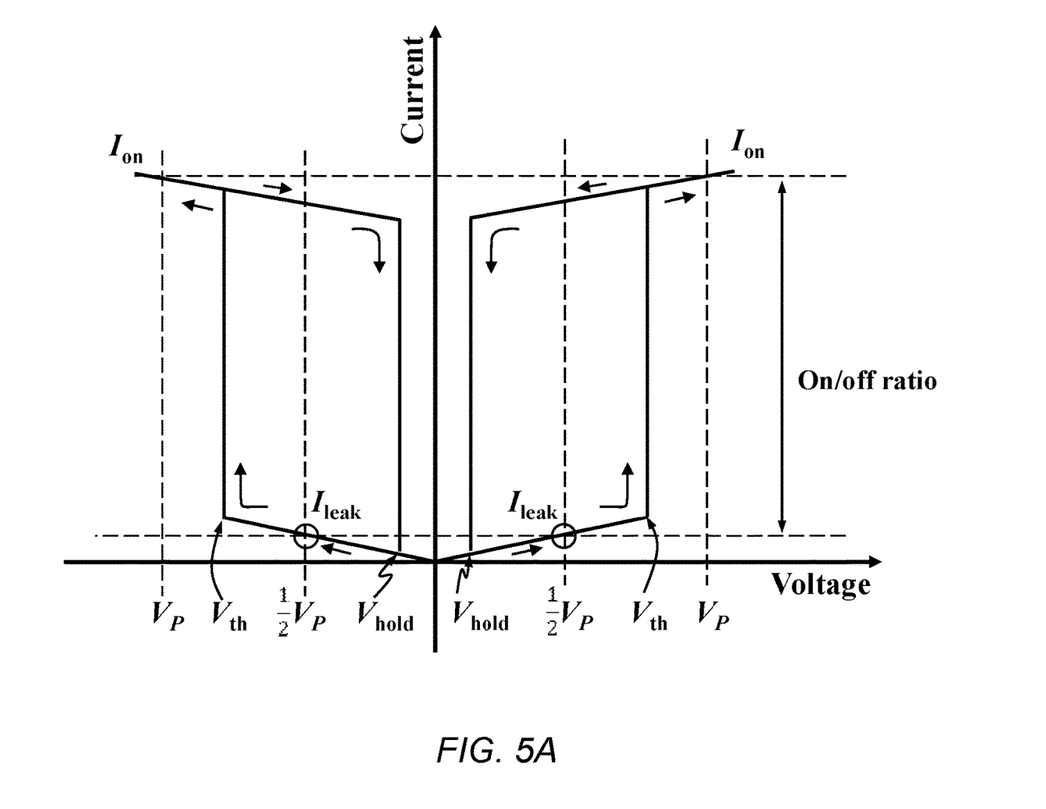
FIG. 5A is an I-V response plot for the two-terminal selector element of FIG. 4A as an applied voltage cycles from zero to $V_p$ and back.
Figure 7:
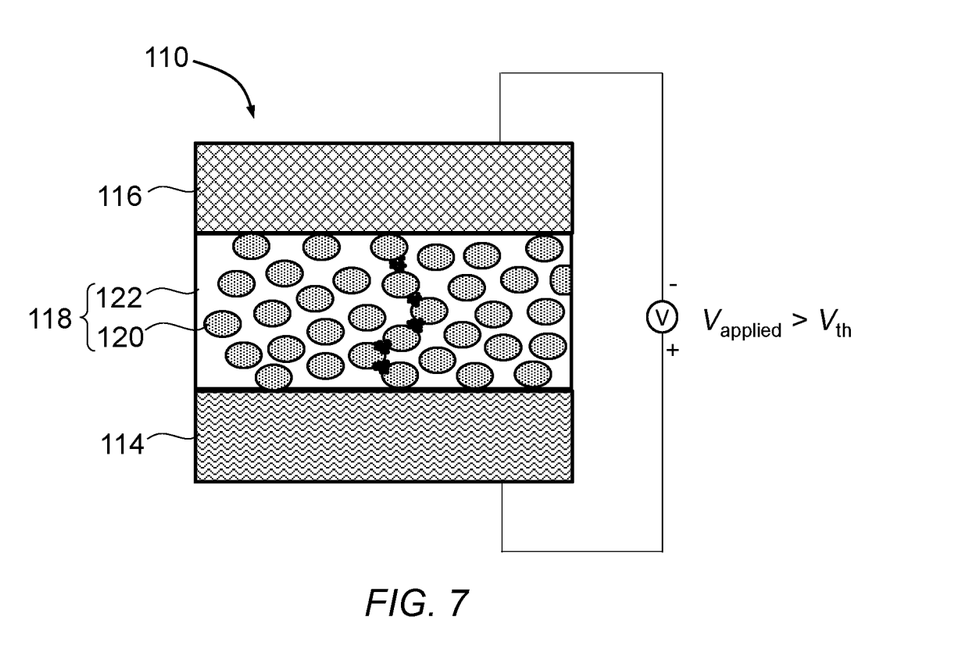
FIG. 7 illustrates formation of a conductive path in a switching layer by applying a positive voltage to a bottom electrode.

With continuing reference to FIG. 5A, the I-V response of the selector element 110 is characterized by a hysteresis behavior as the applied voltage is increased from zero to $V_p$ and decreased back to zero again. The current response behaves like a step function as the applied voltage increases from zero to $V_p$ with the sharp increase occurring at or near $V_{th}$. As the voltage decreases from $V_p$ to zero, the current markedly decreases at or near $V_{hold}$, which is lower than $V_p$. The two-terminal selector element 110 is bi-directional as the polarity of the applied voltage may be reversed as illustrated in the I-V plot of FIG. 5A. The IV-response corresponding to the opposite polarity is substantially similar to that described above. When $V_{applied}$ exceeds $V_{th}$, one or more conductive paths form between the electrodes 114 and 116 as shown in FIG. 7, resulting in the two-terminal selector element 110 being in the highly conductive state.

Figure 5B:
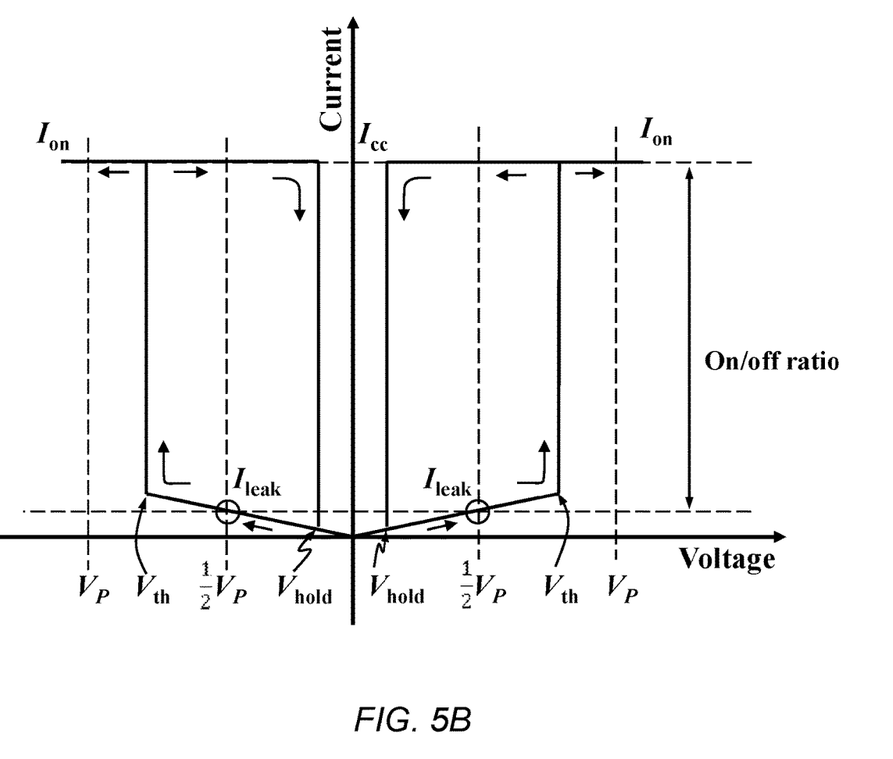
FIG. 5B is another I-V response plot for the two-terminal selector element of FIG. 4A as an applied voltage cycles from zero to $V_p$ and back.

Alternatively, the two-terminal selector element 110 may exhibit a different I-V response as illustrated in FIG. 5B. The I-V plot of FIG. 5B differs from that of FIG. 5A in that the current remains relatively constant (compliance current, $I_{cc}$) even as the applied voltage decreases from $V_p$ to $V_{hold}$. Therefore, the selector element 110 remains in the highly conductive state and the conductive paths previously formed in the switching layer 118 remain mostly intact as illustrated in FIG. 6B.

Figure 8:
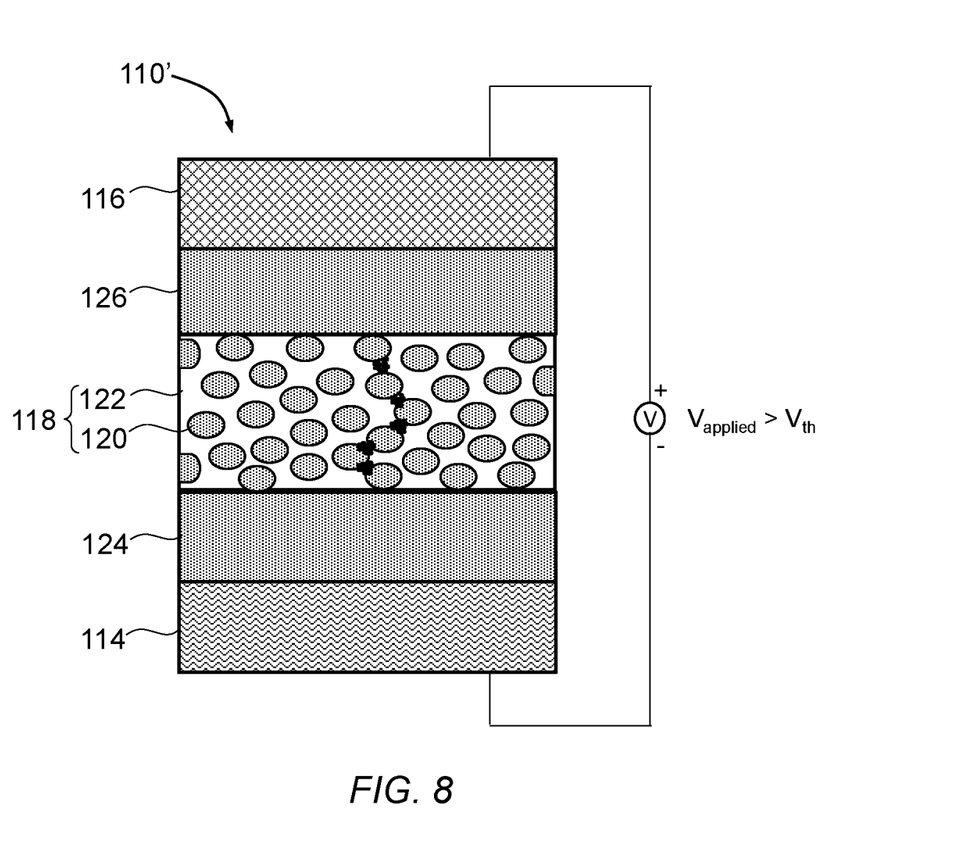
FIG. 8 is a cross sectional view of a two-terminal selector element that incorporates therein additional electrode layers in accordance with another embodiment of the present invention.

FIG. 8 shows another embodiment of the present invention as applied to a two-terminal selector element 110' that may replace the two-terminal selector element 110 in the memory cells 102. In the drawing, reference numerals 114 to 122 denote the same or similar components as those shown for the memory cell 110 in FIGS. 4A and 4B. The selector element 110' is different from the selector element 110 in that an additional third electrode 124 is formed between the first electrode 114 and the switching layer 118 and an additional fourth electrode 126 is formed between the second electrode 116 and the switching layer 118. Each of the third and fourth electrodes 124 and 126 may be made of a suitable conductor material, such as but not limited to gold (Au), silver (Ag), platinum (Pt), palladium (Pd), rhodium (Rh), iridium (Ir), ruthenium (Ru), osmium (Os), rhenium (Re), nickel (Ni), copper (Cu), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), tungsten nitride (WN), or any combination thereof. In an embodiment, both the third and fourth electrodes 124 and 126 are made of a same conductor material (i.e. symmetric). In an alternative embodiment, the third and fourth electrodes 124 and 126 are made of different conductor materials (i.e. asymmetric). In another embodiment, the metal-rich clusters 120 in the switching layer 118 and at least one of the third and fourth electrodes 124 and 126 are made of a same conductor material, such as but not limited to silver (Ag), copper (Cu), zinc (Zn), titanium (Ti), or any combination thereof. In still another embodiment, the third and fourth electrodes 124 and 126 have different composition(s) compared with the metal-rich clusters 120. For example, the electrodes 124 and 126 each may be made of a conductor material, such as but not limited to silver (Ag), copper (Cu), zinc (Zn), titanium (Ti), or any combination thereof, while the metal-rich clusters 120 may be made of a material with relatively lower diffusion and drift speed, such as but not limited to titanium nitride (TiN), tantalum nitride (TaN), tungsten (W), or any combination thereof.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A memory device comprising an array of memory cells, each of said memory cells including a memory element connected to a two-terminal selector element, said two-terminal selector element comprising a first electrode and a second electrode with a switching layer interposed therebetween, said switching layer including a plurality of metal-rich clusters embedded in a matrix, wherein said switching layer has single resistance state in absence of an applied voltage thereto.

2. The memory device of claim 1 further comprising:
   a plurality of first conductor lines extending along a first direction, each of said first conductor lines being coupled to a respective row of said memory cells at one ends; and
   a plurality of second conductor lines extending along a second direction substantially perpendicular to said first direction, each of said second conductor lines being coupled to a respective row of said memory cells at the other ends.

3. The memory device of claim 1, wherein said matrix is made of a chalcogenide.

4. The memory device of claim 1, wherein said matrix is made of an oxide.

5. The memory device of claim 1, wherein said matrix is made of an insulator.

6. The memory device of claim 1, wherein said matrix is noncrystalline.

7. The memory device of claim 1, wherein said plurality of metal-rich clusters are made of a material selected from the group consisting of silver, copper, zinc, titanium, titanium nitride, tantalum nitride, tungsten, and any combinations thereof.

8. The memory device of claim 1, wherein said first and second electrodes are made of a same material.

9. The memory device of claim 1, wherein each of said first and second electrodes is made of a material selected from the group consisting of platinum, iridium, ruthenium, gold, and any combinations thereof.

10. The memory device of claim 1, wherein said plurality of metal-rich clusters and at least one of said first and second electrodes are made of a same material.

11. The memory device of claim 1, wherein each of said memory cells further includes an intermediate electrode interposed between said memory element and said two-terminal selector element.

12. The memory device of claim 11, wherein said intermediate electrode is made of a silicide or a nitride.

13. The memory device of claim 1, wherein said memory element includes a magnetic free layer and a magnetic reference layer with an insulating tunnel junction layer interposed therebetween.

14. The memory device of claim 13, wherein said magnetic free layer has a variable magnetization direction substantially perpendicular to a layer plane thereof, said magnetic reference layer has a fixed magnetization direction substantially perpendicular to a layer plane thereof.

15. The memory device of claim 1, wherein said two-terminal selector element further comprises:
a third electrode formed between said first electrode and said switching layer; and
a fourth electrode formed between said second electrode and said switching layer.

16. The memory device of claim 15, wherein said third and fourth electrodes are made of a same material.

17. The memory device of claim 15, wherein said plurality of metal-rich clusters and at least one of said third and fourth electrodes are made of a same material.

18. The memory device of claim 15, wherein said plurality of metal-rich clusters are made of a material selected from the group consisting of titanium nitride, tantalum nitride, tungsten, and any combinations thereof, each of said third and fourth electrodes is made of a material selected from the group consisting of silver, copper, zinc, titanium, and any combinations thereof.

19. The memory device of claim 15, wherein each of said first and second electrodes is made of a material selected from the group consisting of platinum, iridium, ruthenium, and any combinations thereof, said plurality of metal-rich clusters and said third and fourth electrodes are made of a same material selected from the group consisting of silver, copper, zinc, titanium, and any combinations thereof.

20. A memory device comprising an array of memory cells, each of said memory cells including a memory element connected to a two-terminal selector element, said two-terminal selector element comprising a first electrode and a second electrode with a switching layer interposed therebetween, said switching layer including a plurality of metal-rich clusters embedded in a matrix, wherein each of said first and second electrodes is made of a material selected from the group consisting of iridium, ruthenium, and any combinations thereof.

* * * * *